United States Patent [19]

Brilka

[11] Patent Number: 4,994,756

[45] Date of Patent: Feb. 19, 1991

[54] CIRCUIT ARRANGEMENT FOR AMPLIFYING A TELEVISION SIGNAL

[75] Inventor: Joachim C. Brilka, Hamburg, Fed. Rep. of Germany

[73] Assignee: U.S. Philips Corporation, New York, N.Y.

[21] Appl. No.: 391,409

[22] Filed: Aug. 4, 1989

Related U.S. Application Data

[63] Continuation of Ser. No. 187,613, Apr. 28, 1988, abandoned.

[30] Foreign Application Priority Data

May 2, 1987 [DE] Fed. Rep. of Germany ....... 3714643

[51] Int. Cl.$^5$ ............................................. H03F 3/45
[52] U.S. Cl. .................................... 330/260; 358/184
[58] Field of Search ................ 330/255, 260; 358/184, 358/188

[56] References Cited

U.S. PATENT DOCUMENTS 3,530,395  9/1970  Prusha ........................... 330/260 X
4,104,678  8/1978  Van Roessel ....................... 358/184

FOREIGN PATENT DOCUMENTS 1563143   4/1969  France ............................... 358/188
140776  11/1981  Japan .................................. 358/184
15478   1/1986  Japan .
39780   2/1986  Japan .

*Primary Examiner*—James B. Mullins
*Attorney, Agent, or Firm*—Edward W. Goodman

[57] ABSTRACT

In a circuit arrangement for amplifying a television signal, having, arranged between an input (2, 3) and an output (6), a differential amplifier (1) comprising two emitter-coupled transistors (101, 102), high linearity and stability is obtained in spite of a low supply voltage, a high drive and manufacture in a method which produces transistors with a comparatively low "Early-voltage", by a combination of at least one ohmic resistor (103, 104; 202) arranged in the emitter branch of the transistors (101, 102) and a resistive feedback network (7) for feeding back a signal from the output (6) to the input (2, 3).

1 Claim, 3 Drawing Sheets

CIRCUIT ARRANGEMENT FOR AMPLIFYING A TELEVISION SIGNAL

This is a continuation of application Ser. No. 07/187,613, filed Apr. 28, 1988, now abandoned.

BACKGROUND OF THE INVENTION

1. Field of the Invention

The invention relates to a circuit arrangement for amplifying a television signal, having, arranged between an input and an output, a differential amplifier comprising two emitter-coupled transistors.

2. Description of Related Art

Circuit arrangements of this type are known and are used, more specifically, in integrated circuits, for example to amplify a television signal in the baseband. These integrated circuits are standardized for a power supply of 12 V and amplify the television signal on a voltage swing of, typically, 1 to 2 V. Such arrangements must satisfy high requirements as regards their gain factor, linearity and stability, their assembly must be effected in an integrated circuit production method which is easy to maintain and consequently must be inexpensive, and the circuit arrangements themselves must be of a simple space-saving construction. In the known circuit arrangements, these requirements are satisfied in that the voltage swing of the television signal remains small relative to the supply voltage.

To reduce the power consumption of television receivers and like apparatus, it is desirable to reduce the supply voltages for circuit arrangements incorporated therein for the processing of television signals, to a value which is located in the order of magnitude of the voltage swing of the television signal, more specifically to, for example, 5 V. This renders it possible to run the television receiver from a battery.

On the other hand, given signal transmission properties require currents which, with the object of power reduction, cannot be optionally reduced. It has been found that the circuit concepts which have been used so lar for this case no longer satisfy the requirements to be imposed on the processing of television signals, particularly as regards linearity and stability.

SUMMARY OF THE INVENTION

The invention has for its object to provide a circuit arrangement for amplifying a television signal which can be produced by means of the above-mentioned production method and, in spite of a lower supply voltage and a higher drive by the television signal, operates linearly and stably to a high extent.

In a circuit arrangement of the type defined in the opening paragraph, according to the invention, this object is accomplished by a combination of at least one ohmic resistor arranged in the emitter branch of the transistors and a resistive feedback network for feeding back a signal from the output to the input.

The production (diffusion) method mentioned in the foregoing, which is preferred for the production of integrated circuits on a semiconductor plate, has the advantageous feature that the diffusion provides components with small layer thicknesses. The object is to provide components and circuits with good high frequency properties, which are required, more specifically for the processing of IF signals in television receiver arrangements It has been found that the (bipolar) transistors obtained therewith have a relatively low "Early voltage" corresponding to a relatively high dependence of the collector currents of this transistor on their collector-emitter voltages, also in the amplifier range. As a result thereof particularly in the event of higher current or voltage swings, non-linear distortions occur in the transistors, which become particularly noticeable at low supply voltages and simultaneous high signal voltage swings. The measures in accordance with the invention reduce the influence of these non-linearities on the gain characteristic to such an extent that the high requirements imposed on the linearity during the processing of the television signals can be satisfied. More specifically, this provides a circuit for arrangement amplifying a television signal, having over the overall frequency band used by the television signal, a uniformly high gain and also above this frequency band, a steep downward slope of the amplitude-frequency characteristic. Thus a high gain of the useful signal is linked with a high stability of the circuit arrangement which is fed back via the resistive feedback network. By using a purely resistive feedback network, a slight phase shift between the television signal at the input and the signal at the output and consequently a high stability is then obtained.

Combining the ohmic resistance in the emitter branches with the resistive feedback network advantageously enables a setting of the amplitude-frequency characteristic of the circuit arrangement in their two degrees of freedom. The emitter resistors basically determine the decrease of the amplitude-frequency characteristic above the frequency band of the television signal and consequently the stability, while the resistive feedback network basically determines the setting of the gain within the frequency band of the television signal. The circuit arrangement according to the invention has a very high linearity, which expresses itself in a very low amplitude and phase distortion and consequently a very low distortion factor. This renders it possible to obtain high voltage swings of the television signal at the output at a lower supply voltage and a lower power dissipation determined thereby. The gain in the frequency band of the television signal can freely be chosen in wide ranges by the rating of the resistive feedback network only at a uniformly good linearity. The circuit arrangement according to the invention then has a high gain-band width product and simultaneously a good stability. In addition, by using a frequency-independent feedback network and a frequency-independent resistance in the emitter branches, a very regular variation of the amplitude-frequency characteristic in the frequency band of the television signal is ensured.

Advantageously, the television signal is conveyed to the input via at least one emitter-follower stage. This accomplishes an impedance transformation and decoupling of preceding circuit portions producing the television signal. This is more specifically of advantage when the circuit arrangement in accordance with the invention is directly fed from the output of a demodulator. The emitter-follower stages then prevent a retroaction on the demodulator and otherwise suppress signal distortions produced in the demodulator.

In an advantageous further development of the invention, a circuit arrangement according to the invention, having an input with two input terminals, a first terminal of which is connected to the feedback network, includes a resistive compensation network for feeding a portion of the signal from the output into a second terminal of the two input terminals. When on)y one of two inputs terminals receives the signal from the output for feedback purposes, there are different voltages on these terminals by which the circuit arrangement is differently driven. More specifically, emitter-follower stages connected to the input terminals are consequently driven differently, so that non-linear distortions occur at these stages The resistive compensation network applies a portion of the signals from the output of the circuit arrangement also to the second input terminal and consequently to the second emitter-follower stage coupled thereto, in such manner that the emitter-follower stages are uniformly driven. Their drive ranges in the family of characteristics of the transistors constituting them are then identical, so that corresponding current and voltage variations can be obtained in the overall drive range determined by the television signal.

BRIEF DESCRIPTION OF THE DRAWINGS

Some embodiments of the invention are shown by way of example in the accompanying drawings and will be described in detail hereinafter. In the drawing.

DESCRIPTION OF THE PREFERRED EMBODIMENTS

Figure 1:
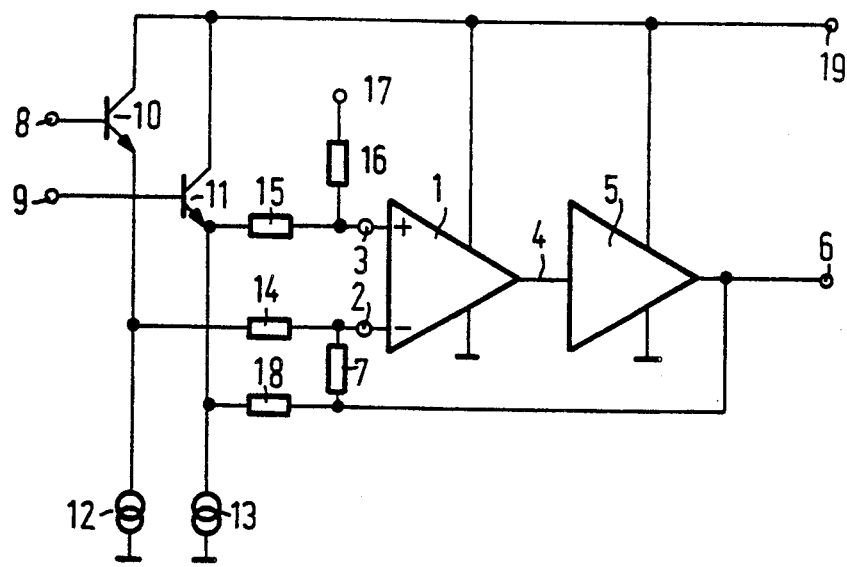
FIG. 1 is a block circuit diagram of a first embodiment of a circuit arrangement according to the invention which is implemented as a video pre-amplifier.

In the block circuit diagram of FIG. 1, reference numeral 1 denotes a differential amplifier whose inverting input 2 and non-inverting input 3 constitute two input terminals of an input. The differential amplifier 1 supplies to a differential amplifier output 4 a signal corresponding to tee amplified difference between the voltages at the input terminals 2 and 3. This signal is applied to an output 6 via a power amplifier 5 which, in contrast to the differential amplifier 1, has only a low voltage gain, preferably equal to unity, and consequently also functions as an impedance transformer stage. The inverting input 2 of the differential amplifier 1, which corresponds to the first input terminal, is connected via a feedback resistor 7 to the output 6 which in the present case constitutes a very simple resistive feedback network through which a signal is fed back from the output 6 to the input terminal 2. The gain of the circuit arrangement comprising the differential amplifier 1 and the power amplifier 5 is set by this feedback in the frequency range of the television signal to be amplified.

The television signal to be amplified is applied to the respective input terminals 2 and 3 via two supply lines 8, 9 to which it is applied by a device, for example a demodulator, not shown, each via an emitter-follower stage each including a transistor 10, 11 and a current source 12, 13 and also an input resistor 14, 15. The respective emitter-follower stages 10, 12 and 11, 13 constitute highly resistive loads for the supply lines 8 and 9, respectively, and low-impedance signal sources for the input terminals 2 and 3, respectively. As a result thereof, a retroaction on the devices preceding the circuit arrangement shown is prevented. The emitter-follower stages 10, 11 and 12, 13 are for this reason not included in the feedback loop formed by the feedback resistor 7. Consequently, non-linearities in the transmission behavior of the circuit arrangement shown, which might be produced by the transistors 10 11 of the emitter-follower stages, are not compensated for by the feedback loop. This compensation is instead effected, on the one hand, by the respective current source 12 and 13 by means of which fixed currents are impressed on the transistors 10 and 11, respectively, and also by a low drive of the resistors 10 11 at their base terminals, which preVents the input characteristics of the transistors 10 and 11, respectively, from being driven in noticeably non-linear ranges.

On the other hand, however, a non-linear distortion of the voltages at the input terminals 2 and 3 is caused by the different load, which depends on the television signal to be amplified, of the first input terminal 2 by the signal at the output 6 via the feedback resistor 7. As a result thereof, a Signal-dependent current is applied to the emitter terminal of the transistor 10 of the first emitter-follower stage, which produces a voltage distortion at the first input terminal 2 via the current-voltage characteristic of the transistor 10. This voltage distortion does n:t occur at the second input terminal 3, which is connected via a series resistor 16 to the terminal 17 of a reference voltage source, which supplies a constant d c. voltage. To suppress such non-linearities, a resistive compensation network constituted by a compensation resistor 18 is inserted between the output 6 and the emitter terminal of the transistor 11 of the second emitter-follower stage 11, 13. This compensation resistor 18 is rated such that via this resistor, the signal at the output 6 has the same influence on the emitter terminal of the transistor 11 of the second emitter-follower stage 11, 13 as on the emitter terminal of the transistor 10 of the first emitter-follower stage 10, 12 via the feedback resistor 7 and the input resistor 14. Thus the non-linearities effected by the first and second emitter-follower stages are compensated for.

The emitter-follower stages 10, 12 and 11, 13, respectively, of the differential amplifier 1 and the power amplifier 5 are supplied with a d.c. voltage via a common power supply terminal 19.

Figure 3:
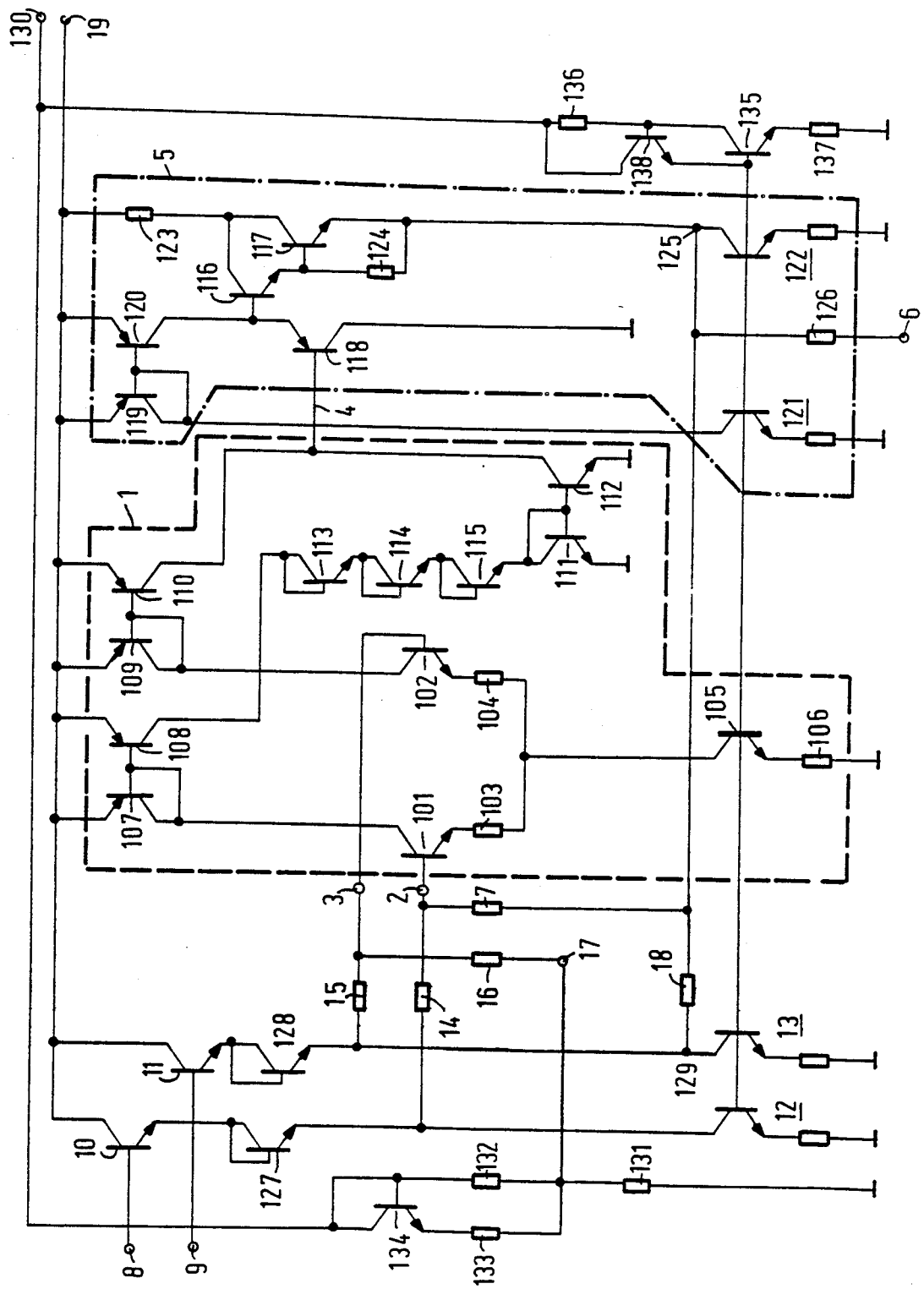
FIG. 3 is a detailed circuit diagram of the embodiment of FIG. 1.

FIG. 3 is a detailed representation of the circuit arrangement of FIG. 1, more specifically, detailed circuits are shown for the differential amplifier 1 and the power amplifier 5. In all other respects, the elements described in FIG. 1 have been given the same reference numerals.

As is shown in FIG. 3, the differential amplifier 1 comprises two emitter-coupled transistors 101, 102, whose emitter terminals are each connected via an emitter resistor 103, 104 to a common current source, formed by a current source transistor 105 and a current source resistor 106. The television signal to be amplified is applied to the transistors 101, 102 via the base terminals connected to the input terminals 2 and 3. The television signal appears in the amplified form as a current difference at the collector terminals of the transistor 101, 102 and is transferred to the differential amplifier output 4 via a current mirror arrangement.

The current mirror arrangement comprises three current mirrors each having two transistors 107, 108 and 109, 110 and 111, 112, respectively. In this situation a first and a second current mirror 107, 108 and 111, 112 respectively, transfers the collector current from the collector terminal of the transistors 101 in one sense, and a third current mirror 109, 110 transfers the collector current from the collector terminal of the transistor 102 in the opposite sense, to the differential amplifier output 4 such that for identical collector currents at the transistor 101, 102, the current sum at the differential amplifier output 4 is canceled to exactly zero. Consequently, only a balanced signal is obtained, while a common-mode signal at the input terminals 2, 3 is suppressed in the differential amplifier 1.

A chain of three diode-connected transistors 113, 114, 115 is inserted between the collector terminals of the transistors 108 and 111 of the first and second current mirrors. These diode-connected transistors produce, between the transistors 108 and 111, a constant potential shift which corresponds to the forward voltage drop of the base-emitter semiconductor junction across the transistors. This prevents excessive differences of the collector-emitter voltages at the transistors 108 and 110 which might result in signal distortions because of the low "Early voltages".

The emitter resistors 103, 101 produce an internal negative feedback of the differential amplifier 1, which effects a broadband limiting of the open-loop gain of the differential amplifier 1 with a minimum phase shift of the signal at the differential amplifier output 4 relative to the signal at the input 2, 3. The emitter resistors 103, 104 are rated such that the open loop-gain of the differential amplifier 1 on reaching ah overall phase shift of 180° between the output 6 and the input 2, 3, (in the event of increasing frequencies of the television signal at the input) has fallen below 0 dB and consequently the circuit arrangement is stable.

In the circuit arrangement shown in FIG. 3, the power amplifier 5 which, in the present example, is basically a Darlington stage formed by two transistors 116, 117 which are driven from the differential amplifier output 1 via a PNP transistor 118 which is contiguous to the differential amplifier output 1 The pNP-transistor 118 is supplied, via a fourth current mirror consisting of two transistors 119, 120, with an impressed current from a current source 121 which is formed by a transistor and an associated emitter resistor. A current source 122 of a corresponding structure feeds the load current path of the transistor 117 of the Darlington stage and for this purpose is arranged in series between the supply voltage terminal 19 and ground, with the transistor 117 and a collector-series resistor 123 which serves as a protection resistor should a short-circuit occur at the output. In addition, the base-emitter path of the transistor 117 is bypassed by a parallel resistor 124 as a direct current supply for the transistor 116. The amplified television signal is conveyed to the output 6 from a junction point 125 between the transistor 117 and the current source 122 via an output resistor 126.

In addition, the feedback resistor 7 is connected from the junction point 125 to the first input terminal 2 at the inverting input of the differential amplifier 1. By the choice of the value of the feedback resistor 7, the gain of the overall circuit arrangement between the input 2, 3 and the output 6 is set. Basically, this sets the gain in the frequency band of the television signal to be amplified, while the drop in the amplitude-frequency characteristic to higher frequencies is fundamentally not influenced by the feedback resistor 7.

The television signal to be amplified is applied from the connecting lines 8, 9 to the input terminals 2 and 3, respectively, via the two transistors 10, 11 as well as via the transistors 127, 128 connected as diodes in their emitter branches and the input resistors 14, 15. Together with the current sources 12, 13, which each also consist of a transistor with emitter resistor, the transistors 10, 127 and 11, 128 form two emitter-follower stages for the low-reactive supply of the television signal to be amplified to the differential amplifier 1. The transistors 127, 128 serve for shifting the potential between the emitter terminals of the transistors 10, 11 and the input terminals 2, 3; together with the base-emitter paths of the transistors 10, 11, they each produce a potential jump of two base-emitter forward voltages between the connecting lines 8 and 9, respectively, and the input terminals 2 and 3, respectively.

The second input terminal 3 is connected via the series resistor 16 to the terminal 17 of a reference voltage source across which there is an in essence constant voltage. In contrast thereto, the signal from the junction point 125 is applied with a relatively high amplitude to the first input terminal 2 via the feedback resistor 7, so that different current drives and consequently distortions occur at the transistors 10, 11, 127 and 128. To eliminate these different current drives and distortions, the compensation resistor 18 is inserted between the junction point 125, on the one hand and a junction point 129 between the transistor 128 and the current source 13, on the other hand. Via this compensation resistor 18 a portion of the signal from the junction point 125, or from the output 6, respectively, is also applied to the transistors 11, 128, so that in total, a distortion-free drive can be obtained.

With the aid of a voltage divider, constituted by a series arrangement of a first resistor 131 with the parallel circuit consisting of a second resistor 132 and a series arrangement of a third resistor 133 with a diode-connected transistor 131, the voltage at the terminal 17 is derived from a stabilized voltage together with the third resistor 133, the transistor 13: forms a shunt to the second resistor 132 which carries the main portion of the current flowing in the voltage divider. This shunt is rendered temperature-dependent by the transistor 134; and the temperature-dependence thus produced in the voltage at the terminal 17 serves to compensate for the temperature effect of the emitter-follower stages 10, 11, 127, 128.

A further voltage divider, formed by a transistor 135, an associated collector resistor 136 and an emitter resistor and also a parallel transistor 138, whose emitter terminal is connected to the base terminal of the transistor 135 and the base terminal thereof to the collector terminal of the transistor 135 and whose base-collector path is in parallel with the collector resistor 136, is arranged between the reference voltage-supply terminal 130 and ground. A control voltage for the current sources 12, 13, 121, 122 and 105, 106, respectively, whose transistors constitute a current-mirror arrangement together with the transistor 135, is taken from the base terminal of the transistor 135.

The power supply terminal 19, connected to the emitter-follower stages 10, 11, 12, 13 and also to the differential amplifier 1 and the power amplifier 5 for supplying electric energy, is separated from the reference-voltage supply terminal 130, so that any voltage interferences straying into the supply voltage terminal 19 in response to high loads on the output 6 have no influence on the reference voltages or currents, respectively. This contributes to a low-distortion signal amplification of the described circuit arrangement. In addition for the purpose of energy supply, a voltage which exceeds the reference voltages and can be derived from the latter, is preferably available at the supply voltage terminal 19. The advantage of a separate preferably individually stabilized voltage at the reference voltage supply terminal 130 is its improved "hum" suppression (line voltage hum).

Figure 2:
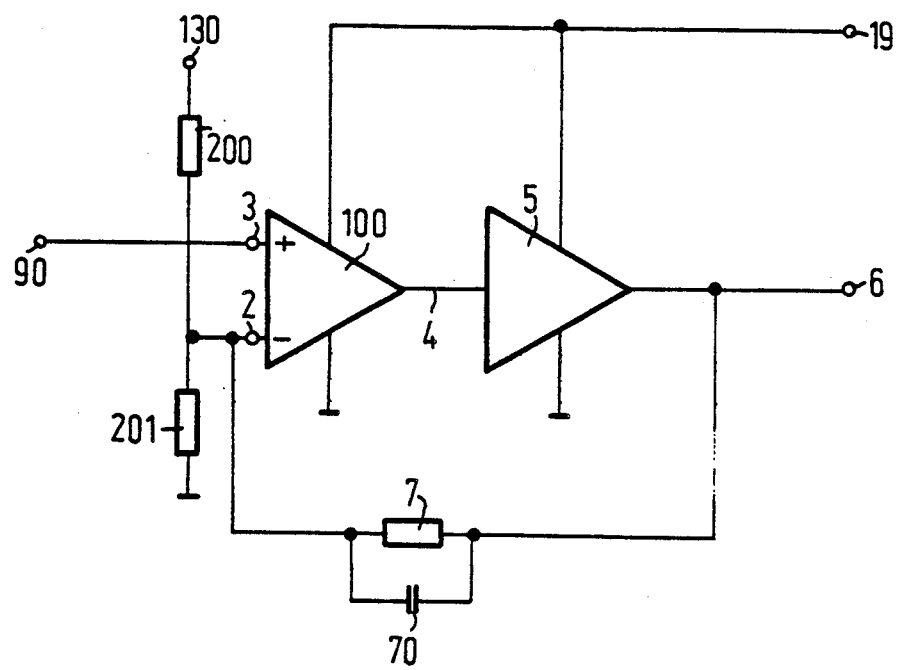
FIG. 2 is a block circuit diagram of a further embodiment of the invention designed as a video post amplifier.
Figure 4:
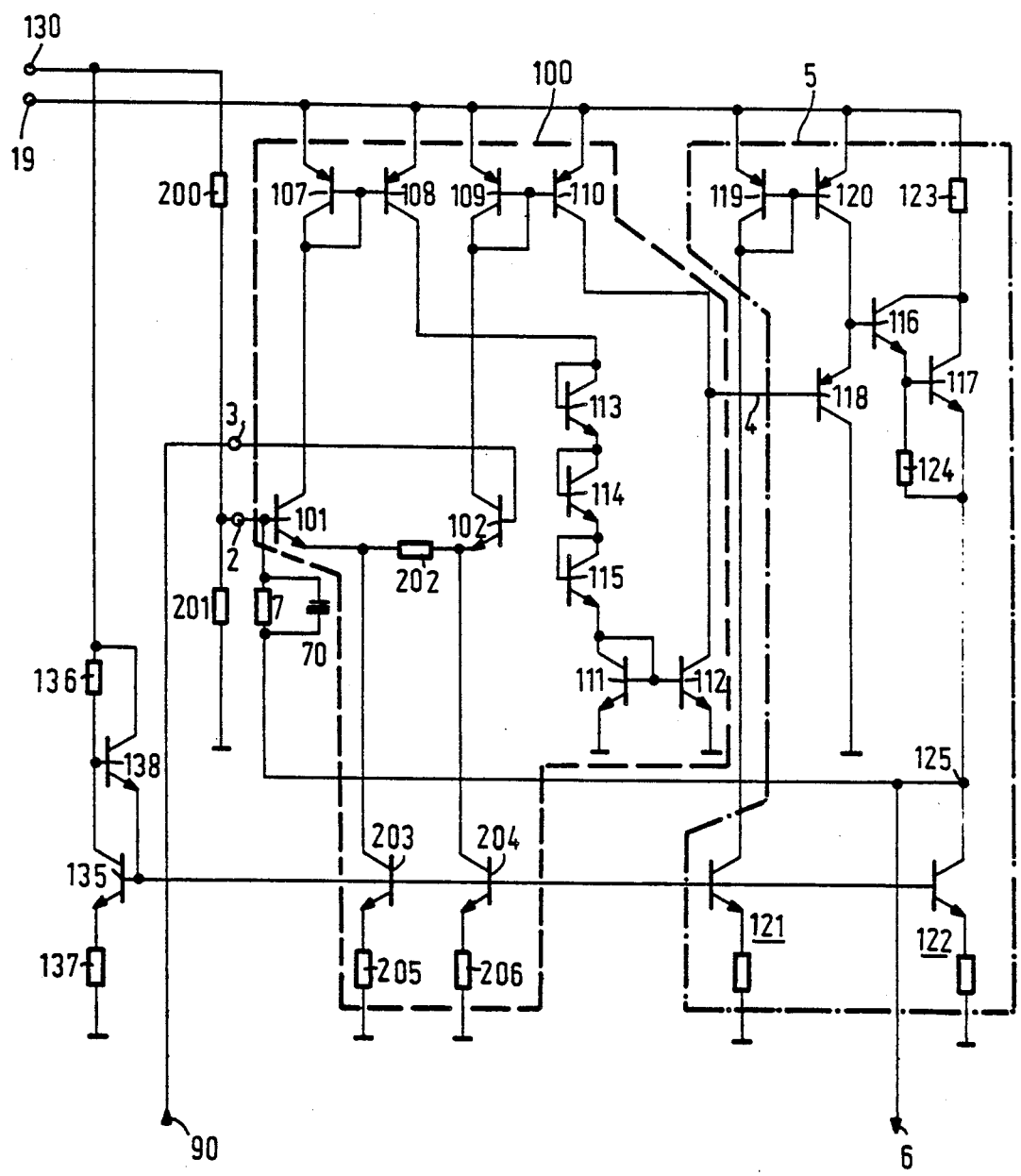
FIG. 4 is a detailed circuit diagram of the embodiment of FIG. 2.

FIGS. 2 and 1 show a further embodiment of the invention in the form of a block circuit diagram and a detailed circuit diagram, respectively. Components corresponding to those in FIGS. 1 and 3 are given the same reference numerals. The circuit arrangements of FIGS. 2 and 4 show a video post amplifier formed by a differential amplifier 100 which is a modification of the differential amplifier 1 and also the identical power amplifier 5. This video post amplifier has for its object to further amplify the amplified television signal produced by the video pre-amplifier shown in FIGS. 1 or 3, and a what is referred to as a sound carrier trap is connected to the output 6 of the output amplifier, preferably via a cut-off filter which suppresses the modulated sound signals. The video post amplifier shown in FIGS. 2 and 4 includes for that purpose, in contrast to the video pre-amplifier, a single-ended input 90 which is directly connected to the second input terminal 3 formed by the non-inverting input of the differential amplifier 100, and the emitter-follower stages of FIGS. 1 and 3 and all the circuit portions associated therewith are omitted from the video post amplifier. This amplifier is used for power amplification but has a relatively low voltage gain factor. The requirements to obtain linearity and stability are less stringent than those for the arrangements shown in the FIGS. 1 and 3. Consequently, in parallel with the feedback resistor 7, a capacitor 70 can be connected which effects a low-pass type feedback with, compared with the arrangements of FIGS. 1 and 3, a higher phase shift. With this arrangement, a higher voltage gain and, at the same time, stability cannot be obtained anymore.

The arrangement of FIG. 2 shows an embodiment in accordance with the invention which is designed for less stringent requirements on its transfer properties, more specifically on its stability. As is also the case in the video pre-amplifier, the voltage gain, linearity and stability in the video post amplifier of FIGS. 2 and 4 is obtained in the first place by the combination of an internal negative feedback and an external positive feedback The capacitor 70 is preferably rated such that it does not become operative until in the range of the parasitic higher harmonics with the object of suppressing these harmonics, so that it cannot exert any critical influence on the stability. The capacitor has, more specifically, a capacitance value of the order of 1 pF. In the present manufacturing method, this implies a capacitor surface area on the semiconductor plate of approximately one thousandth of a square millimeter. The manufacturing tolerances occurring in the production of such surface areas might lead to instabilities, when the capacitor 70 would have a decisive influence on the stability of the circuit arrangement.

In the video post amplifier shown in FIG. 2 the first input terminal 2 is furthermore connected to the tap of a voltage divider which is arranged between the reference voltage-supply terminal 103 and ground and consists of two resistors 200, 201 for setting the operating point of the differential amplifier 100.

In the detailed circuit diagram of FIG. 4, the components of the differential amplifier 100 are enclosed in a broken-line box. The differential amplifier 100 corresponds to a very large extent to the differential amplifier 1 of FIG. 3, only the coupling of the emitter terminals of the transistors 101, 102 is modified and is effected via a common emitter resistor 202. Each emitter terminal is furthermore connected to an emitter current source formed by a current source transistor 203 and 204, respectively, and a current source resistor 205 and 206, respectively. While the mode of functioning of this arrangement corresponds in essence to that of the emitter resistors 103, 101 and the common current sources 105, 106 of FIG. 3, the present configuration is however suitable for higher voltage drives, as no additional direct current-voltage drop as across the emitter resistors 103, 104 occurs between the emitter terminals of the transistors 101, 102 and the associated emitter current sources.

The power amplifier 5 is identical to the power amplifier 5 of FIG. 3. Also the further voltage divider 135 to 138 for controlling the current source transistors 203, 204, 121 and 122 corresponds to FIG. 3. In contrast therewith, the junction point 125 between the Darlington-stage 116 117 and the current source 122 is directly connected to the output 6 to obtain a lower output resistance.

A circuit arrangement as shown in FIG. 3 would, for example, be dimensioned for an amplification of a television signal by 14 dB to an amplitude of 1 V, while an arrangement of FIG. 4 would be dimensioned for a further amplification of the television signal by 6 dB to an amplitude of the output voltage of 2 V. The values of the components individually are shown for this rating example in the following Tables. With this arrangement, linearity deviations were obtained in the amoUnt of gain of less than 1% and a phase deviation of less than 1° and also a distortion factor of less than 1%. Typically, the dissipation is approximately 13 mW.

TABLE

| Element | Value in FIGS. 1, 3 | FIGS. 2, 4 |
|---|---|---|
| 7 | 10,7 kOhm | 5,3 kOhm |
| Resistor in 12, 13 | 1 kOhm | / |
| 14, 15 | 2 kOhm | / |
| 16 | 6 kOhm | / |
| 18 | 6,5 kOhm | / |
| Voltage on 19 | +5 V | +5 V |
| 103, 104 | 4 kOhm | / |
| 106 | 4,7 kOhm | / |
| Resistor in 121 | 10,1 kOhm | 6,1 Ohm |
| in 122 | 88 Ohm | 38 Ohm |
| 123 | 100 Ohm | 100 Ohm |
| 124 | 3,5 kOhm | 3,5 kOhm |
| 126 | 75 Ohm | / |
| Voltage on 130 | +4 V | +4 V |
| 131 | 14 kOhm | / |
| 132 | 8 kOhm | / |
| 133 | 25 kOhm | / |
| 136 | 12,5 kOhm | 17 kOhm |
| 137 | 1 kOhm | 500 kOhm |
| 70 | / | 1,5 pF |
| 200, 201 | / | 10 kOhm |
| 202 | / | 12 kOhm |
| 205, 206 | / | 6,1 kOhm |
| 107, 108, 109 110, 118, 119, 120 | PNP-Transistors identical design/size | |
| 10, 11, 105, 127, 128, 134 | NPN-Transistor | / |
| Transistors in 12 and 13 | 1. design /-size | |
| 101, 102, 111, 112, 113, 114, 115, 116, 135, 138 | NPN-Transistor, 1. design | NPN-Transistor, 1. design |
| Transistor in 121 | /-size | /-size |
| 203, 204 | / | / |
| Transistor in 122 | NPN-Transistor, /-size | 2. design |
| 117 | NPN-Transistor, | 3. design |

TABLE-continued

| Element | Value in FIGS. 1, 3 /-size | FIGS. 2, 4 |
| --- | --- | --- |

What is claimed is:

1. A differential amplifier circuit comprising:
   first and second circuit inputs and a circuit output;
   a differential amplifier having first and second amplifier inputs and an amplifier output, said amplifier output being coupled to said circuit output;
   first and second impedance transformation stages for coupling said first and second circuit inputs to said first and second amplifier inputs, respectively;
   a resistive feedback network for feeding back an output signal from said circuit output to said first amplifier input; and
   a resistive compensation network coupling said circuit output to an output of said second impedance transformation stage for compensating non-linearities effected by said first and second impedance transformation stages.

* * * * *